United States Patent [19]
Kocmanek et al.

[11] Patent Number: 5,252,520
[45] Date of Patent: Oct. 12, 1993

[54] INTEGRATED CIRCUIT INTERLEVEL DIELECTRIC WHEREIN THE FIRST AND SECOND DIELECTRIC LAYERS ARE FORMED WITH DIFFERENT DENSITIES

[75] Inventors: Karl H. Kocmanek; Leonard J. Olmer, both of Orlando, Fla.

[73] Assignee: AT&T Bell Laboratories, Murray Hill, N.J.

[21] Appl. No.: 786,230

[22] Filed: Oct. 31, 1991

[51] Int. Cl.$^5$ .................. H01L 21/00; H01L 21/02; H01L 21/302; H01L 21/463

[52] U.S. Cl. .................................. 437/235; 437/225; 437/228

[58] Field of Search ................... 437/225, 228, 235

[56] References Cited

U.S. PATENT DOCUMENTS 4,872,947 10/1989 Wang et al. .................... 437/235

OTHER PUBLICATIONS

"Plasma TEOS Process for Interlayer Dielectric Applications," B. L. Chin et al., Solid State Technology, Apr. 1988, pp. 119–122.

"Reactive Facet Tapering of Plasma Oxide for Multilevel Interconnect Applications," T. Abraham, IEEE VLSI Multilevel Interconnection Conference, Jun. 15-16, 1987, 115-121.

Primary Examiner—Brian E. Hearn
Assistant Examiner—B. Everhart
Attorney, Agent, or Firm—John T. Rehberg

[57] ABSTRACT

A method for forming a dielectric layer in an integrated circuit is disclosed. After a first dielectric layer is formed, a second dielectric layer is formed on top of the first layer. The second layer is formed by reducing precursor gas flow during the initial portion of the deposition process so that the initial film density of the deposited dielectric is higher or equal to the density of the bulk of the first and second dielectric.

6 Claims, 1 Drawing Sheet

INTEGRATED CIRCUIT INTERLEVEL DIELECTRIC WHEREIN THE FIRST AND SECOND DIELECTRIC LAYERS ARE FORMED WITH DIFFERENT DENSITIES

TECHNICAL FIELD

This invention relates generally to methods for manufacturing of semiconductor integrated circuits and, more particularly, to methods for forming dielectric layers between electrical conductors.

BACKGROUND OF THE INVENTION

In the manufacture of silicon semiconductor integrated circuits, interlevel dielectrics may be formed by a multi-step technique. The first step involves the deposition (usually in a plasma) of a relatively conformal dielectric layer which covers runners and generally fills the spaces between the runners. The dielectric is then etched back anisotropically to form spacers (although some dielectric may be permitted to remain on top of the runners and the substrate supporting the runners). Then a second dielectric deposition is performed (also usually in a plasma) and the second dielectric is subjected to a planarizing etch-back. The double-deposition procedure helps to prevent the formation of soft oxides or voids in the dielectric between the runners.

After the interlevel dielectric is completely formed, vias may be opened in the dielectric to expose portions of the underlying conductors so that an upper level of metalization may be connected through the vias. It is believed that subsequent to via opening, either chemical attack or water adsorption tends to occur within the via at the interface between the dielectric layers created by the above-described dual deposition process. Subsequent metal deposition within the via is degraded, thus adversely affecting integrated circuit performance.

SUMMARY OF THE INVENTION

It is believed that the interface between the two dielectric layers is vulnerable to attack because the plasma process used to form the second dielectric is not completely stable during the first few seconds after inception. Consequently, the first hundred angstroms of the second layer may have a lower density than the remainder of the second layer.

Applicants' process alleviates this problem by controlling precursor gas flow so that the flow rate during deposition of a first portion of the second dielectric is less than the flow rate during deposition of a subsequent portion of the second dielectric. In a preferred embodiment the flow rate which forms that portion of the second dielectric proximate the first dielectric layer is less than the flow rate which forms the remainder of the second dielectric layer.

DETAILED DESCRIPTION

Figure 1:
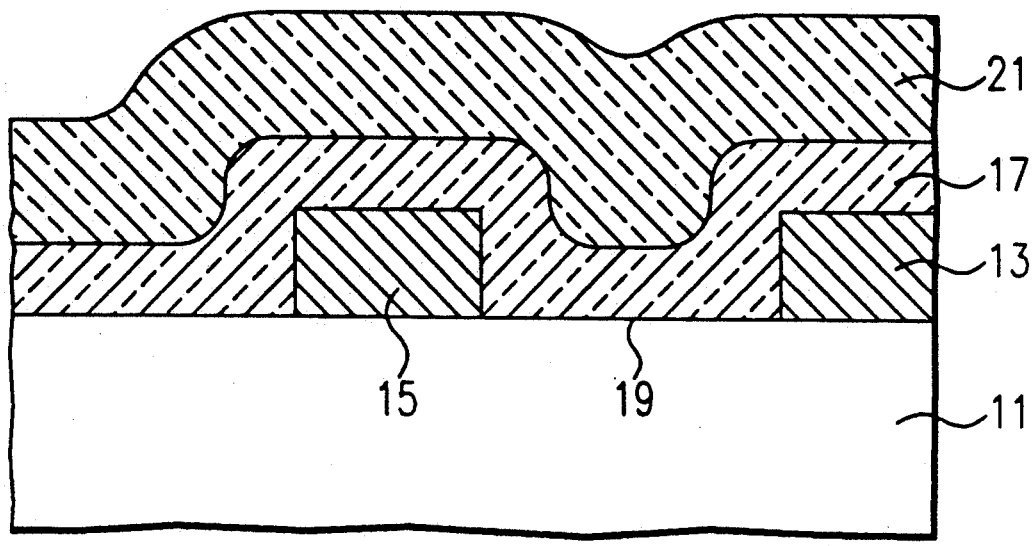
FIGS. 1 and 2 are cross-sectional drawings of an integrated circuit which may be helpful in understanding the principles of this invention.

In FIG. 1, reference numeral 11 indicates a dielectric or other material which may cover a partially fabricated integrated circuit. Reference numerals 13 and 15 indicated conductive runners positioned on the upper surface of dielectric 11. Reference numeral 17 denotes a dielectric layer which covers runners 13 and 15 and the substrate and the dielectric 11 between the runners. Layer 17 may, for example, be formed by depositing approximately 6400 Å of plasma-enhanced TEOS (tetraethoxysilane). The PETEOS may, for example, be deposited in a chemical vapor deposition system such as the AMI 5000 manufactured by Applied Materials Corporation, Santa Clara, Calif. Other equipment may be used. After the PETEOS layer is deposited, it is anisotropically etched back to remove approximately 3700 Å and then cleaned in an ethylene glycol solution, thereby removing another approximately 330 Å and ultimately yielding the dielectric denoted by reference numeral 17. Other processes and thickness may be used.

It will be noted that dielectric layer 17 covers runners 15 and 13 and partially fills space 19 between runners 15 and 13. Next, a second PETEOS deposition of approximately 24,650 Å is performed. The second PETEOS layer is etched back, thus removing 17,920 Å and subjected to an ethylene glycol clean which removes another approximately 350 Å. Thus, the layer denoted by reference numeral 21 is formed. Other thicknesses may be utilized by those skilled in the art.

Figure 2:
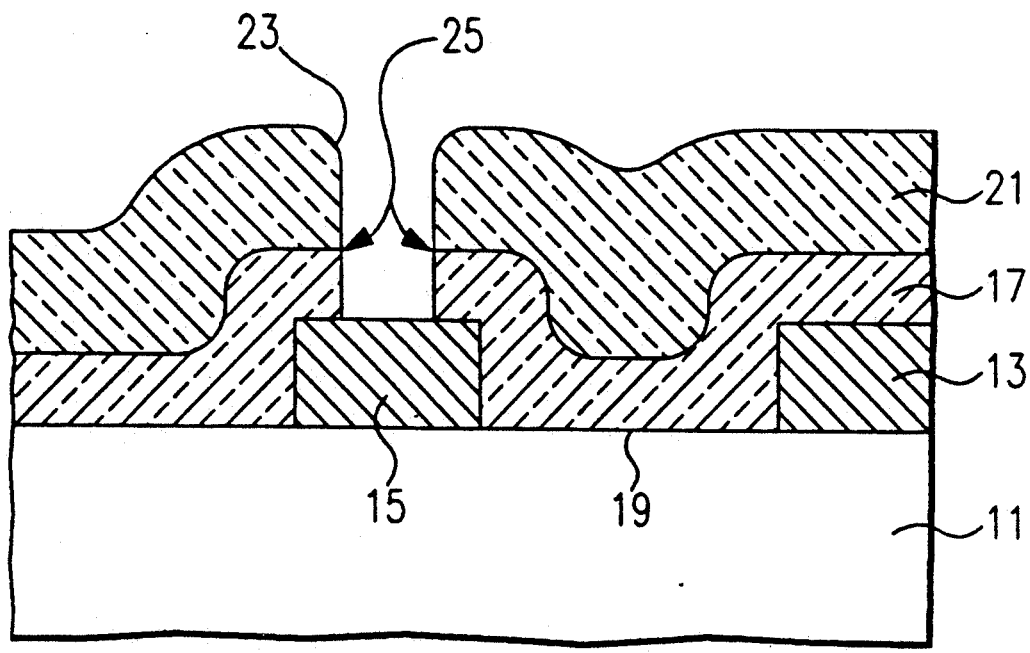

Turning to FIG. 2, via 23 may then be created through dielectric layers 21 and 17, exposing runner 15 using conventional lithographic techniques. It is believed that water intrusion or chemical attack tends to degrade the interface denoted by reference numeral 25 between dielectric layers 17 and 21. Applicants hypothesize that during initiation of the plasma process which forms layer 21, the plasma process is not completely stable. Consequently, the first hundred angstroms of thickness of layer 21 may have a somewhat lower density than the bulk of layer 21 or layer 17. Therefore, applicants endeavor to increase the density of the first-deposited portion of layer 21 relative to what would be obtained under normal start-up operating conditions. It is believed that applicants' process produces a layer 21 with a density at the interface between layers 21 and 17 which equals or exceeds the bulk density of layer 17 alone or the density of the remaining bulk of layer 21.

A denser PETEOS film can be made in several ways. Increasing the RF power is one method, but probably undesirable because of excessive wafer heating and possible radiation damage as well as enhanced degradation of the plasma process kit. A desirable alternative is to lower the deposition rate by lowering the flow of the silicon-containing reagent TEOS. The lower deposition rate allows the growing oxide film to anneal longer during the growth process. This annealing is aided by adsorbed species having longer time to react on the wafer surface, and also aided by ion bombardment by the plasma ions accelerated toward the wafer surface. A minimum of a four second growth of this film is required at half the standard deposition rate.

Therefore, applicants' process includes formation of the initial portion of layer 21, typically in the Applied Materials 5000 reactor, using an RF power of 330 watts (standard operating power); a temperature of 390° C.–400° C. (standard operating temperature); susceptor-showerhead spacing of 190–210 mils (standard spacing); oxygen flow of 350 sccm (standard oxygen flow for five inch wafers); or oxygen flow of 500 sccm (standard oxygen flow for six inch wafers); a pressure of 8–10 Torr (standard operating pressure). However, the helium carrier gas flow into the TEOS bubbler is reduced from approximately 350 sccm to approximately 175 sccm as measured at the input helium flow meter. The inventive principles herein are applicable to other types of deposition apparatus; some tailoring of the flow rate of carrier gases may be necessary to achieve the desired result.

We claim:

1. A method of semiconductor integrated circuit fabrication comprising:
    forming a first dielectric layer, said first dielectric layer having a first density;
    forming a second dielectric layer upon said first dielectric layer, said second dielectric layer having a second density proximate said first dielectric layer which is not less than said first density, said second dielectric layer being formed by a deposition process utilizing a precursor gas in a plasma;
    the flow of said precursor gas being a first value to form that portion of said second dielectric proximate said first dielectric layer and a second value to form the remainder of said second dielectric, said first value being less than said second value.

2. The method of claim 1 in which said first dielectric layer is anisotropically etched back before said second dielectric is formed.

3. The method of claim 2 in which a via is opened through both first and second dielectric layers.

4. The method of claim 1 in which said second dielectric is formed in a reactor having a temperature, pressure, susceptor spacing, oxygen gas flow, and precursor gas flow, said temperature, pressure, susceptor spacing, and oxygen gas flow remaining approximately the same, while said precursor gas flow is temporarily decreased.

5. A method of semiconductor integrated circuit fabrication comprising:
    forming a first dielectric layer in a reactor in a first plasma process characterized by a temperature, pressure, susceptor spacing, oxygen gas flow and precursor gas flow;
    forming a second dielectric layer upon said first dielectric layer, said second dielectric being formed in a reactor in a second plasma process characterized by a temperature, pressure, susceptor spacing, oxygen gas flow, and precursor gas flow, the said temperature, pressure, susceptor spacing, and oxygen gas flow of said second plasma process being approximately the same as the respective temperature, pressure, susceptor spacing, and oxygen gas flow of said first plasma process;
    the said precursor gas flow of said second plasma process being lower than the said respective precursor gas flow of said first plasma process for a predetermined period of time and subsequently being approximately equal to said respective precursor gas flow of said first plasma process.

6. The method of claim 5 in which said precursor gas flow is approximately 175 sccm for said predetermined period of time and 350 sccm for said subsequent period of time.

* * * * *